US006795105B2

(12) United States Patent
Katayama et al.

(10) Patent No.: US 6,795,105 B2
(45) Date of Patent: Sep. 21, 2004

(54) LASER PRINTING METHOD AND APPARATUS

(75) Inventors: Kaoru Katayama, Hadano (JP); Kenichi Inoue, Higashimurayama (JP); Mitsugu Shirai, Hadano (JP); Tsutomu Sakamoto, Hadano (JP)

(73) Assignee: Hitachi, Ltd., Tokyo (JP)

( * ) Notice: Subject to any disclaimer, the term of this patent is extended or adjusted under 35 U.S.C. 154(b) by 52 days.

(21) Appl. No.: 10/095,577

(22) Filed: Mar. 13, 2002

(65) Prior Publication Data

US 2002/0093562 A1 Jul. 18, 2002

Related U.S. Application Data

(63) Continuation of application No. 09/522,016, filed on Mar. 9, 2000, now Pat. No. 6,433,810.

(30) Foreign Application Priority Data

Mar. 11, 1999 (JP) ............................................ 11-065188

(51) Int. Cl.[7] .............................. B41J 2/45; B23K 26/00
(52) U.S. Cl. .................................. 347/238; 219/121.61
(58) Field of Search ................................ 347/224, 225, 347/238, 252, 254, 244, 258; 219/121.6, 121.61, 121.68, 121.62; 250/461.1; 369/116; 134/1.3; 324/760

(56) References Cited

U.S. PATENT DOCUMENTS

| | | | |
|---|---|---|---|
| 4,538,193 A | 8/1985 | Dimmick et al. | 360/256.1 |
| 4,692,829 A | 9/1987 | Campbell | 360/256.1 |
| 5,191,187 A | 3/1993 | Kajikawa | 219/121.76 |
| 5,319,511 A | 6/1994 | Lin | 360/256.1 |
| 5,593,606 A | 1/1997 | Owen et al. | 219/121.71 |
| 5,717,676 A * | 2/1998 | Kaneda et al. | 369/116 |
| 5,833,759 A * | 11/1998 | Haslow et al. | 134/1.3 |
| 5,841,102 A | 11/1998 | Noddin | 219/121.71 |
| 5,886,535 A * | 3/1999 | Budnaitis | 324/760 |
| 6,058,132 A | 5/2000 | Iso et al. | 372/108 |
| 6,066,829 A * | 5/2000 | Ishikawa | 219/121.68 |
| 6,097,742 A | 8/2000 | Caprara et al. | 372/22 |
| 6,117,706 A | 9/2000 | Yoshioka et al. | 438/106 |
| 6,172,325 B1 * | 1/2001 | Baird et al. | 219/121.62 |
| 6,203,952 B1 | 3/2001 | O'Brien et al. | 430/17 |
| 6,433,810 B1 * | 8/2002 | Katayama et al. | 347/238 |

FOREIGN PATENT DOCUMENTS

| | | |
|---|---|---|
| DE | 3826355 | 4/1990 |
| EP | 708 550 | 4/1996 |

OTHER PUBLICATIONS

Miyata, S., "Organic Nonlinear Optical Materials," Journal of the Illuminating Engineering Institute of Japan, Jan. 1993, Japan, vol. 77, No. 1, pp. 33–39.

* cited by examiner

Primary Examiner—Hai Pham
(74) Attorney, Agent, or Firm—Mattingly, Stanger & Malur, P.C.

(57) ABSTRACT

A laser printing apparatus is formed by a laser oscillator 10, galvano mirrors 42, 44 for scanning the laser light emitted from the laser oscillator 10, and an fθ lens 40 for focusing the laser light emitted from the laser oscillator 10 on MCCs 32, 34 serving as the member to be printed. The laser oscillator 10 is an YLF laser oscillator which emits the laser light of the third harmonics in the ultraviolet range. The laser printing is performed on the MCCs 32, 34 serving as the member to be printed by using the laser light emitted from the laser oscillator 10.

28 Claims, 2 Drawing Sheets

LASER PRINTING METHOD AND APPARATUS

This is a continuation application of U.S. Ser. No. 09/522,016, filed Mar. 9, 2000, now U.S. Pat. No. 6,433,810.

BACKGROUND OF THE INVENTION

The present invention relates to a laser printing method and a laser printing apparatus and, more particularly, relates to laser printing method and apparatus suitable for printing characters on base material such as glassy or vitreous material by using laser light beam.

In a module used for a conventional general purpose computer of the like, a carrier board (MCC: microchip for carrier) on which an LSI (large scale integrated circuit) or the like is attached is mounted on a multi layer wiring circuit board (MLC: multi layer ceramics). Number or the like such as a serial number is usually printed on the side surface of the MCC board so as to perform the management of the production or the like. Conventionally, mullite/W has been employed as the material of the MCC board. Further, a YAG laser has been employed as a laser oscillator in the conventional laser printing apparatus for printing characters on the mullite/W board.

BRIEF SUMMARY OF THE INVENTION

Recently, a module used in a general purpose computer has been highly integrated as an LSI, and the MCC has been required to have high accuracy in its parts in accordance with the progress of the integration. The accuracy of the parts is required in the warp of the board, variance in the plate thickness of the board, pitch or the like. The inventors of the present application consider to employ glass/Cu in place of the conventional mullite/W as the material of the board having such a high parts accuracy. It was proved that the parts accuracy can be improved by using the glass/Cu. However, on the other hand, it was proved that the printing quality is not good when the conventional laser printing apparatus prints characters on the glass material such as glass/Cu. To be more concrete, when small-sized characters each having such a width of 0.47 mm and a height of 0.7 mm are printed, it was impossible to discriminate such characters.

Accordingly, an object of the present invention is to provide a laser printing method and a laser printing apparatus which can improve printing quality.

In order to attain the aforesaid object, the present invention is arranged in a manner that in a laser printing method for printing on a member to be printed by using laser light emitted from a laser oscillator, the printing is performed on the member to be printed by using laser light emitted from a solid-state laser oscillator serving as the laser oscillator which emits laser light of third harmonics in an ultraviolet range.

Further, the present invention is arranged in a manner that the laser printing apparatus comprises a laser oscillator, a scanning means for scanning laser light emitted from the laser oscillator, and a converging means for converging the laser light emitted from the laser oscillator on a member to be printed and prints on the member to be printed by using laser light emitted from the laser oscillator, wherein the laser oscillator is a solid-state laser oscillator which emits laser light of third harmonics in an ultraviolet range.

According to such a configuration of the present invention, clear printing can be performed also on a glass type board or the like and the printing quality can be improved.

DETAILED DESCRIPTION OF THE INVENTION

The configuration of the laser printing apparatus according to an embodiment of the present invention will be explained with reference to FIG. 1.

Figure 1:
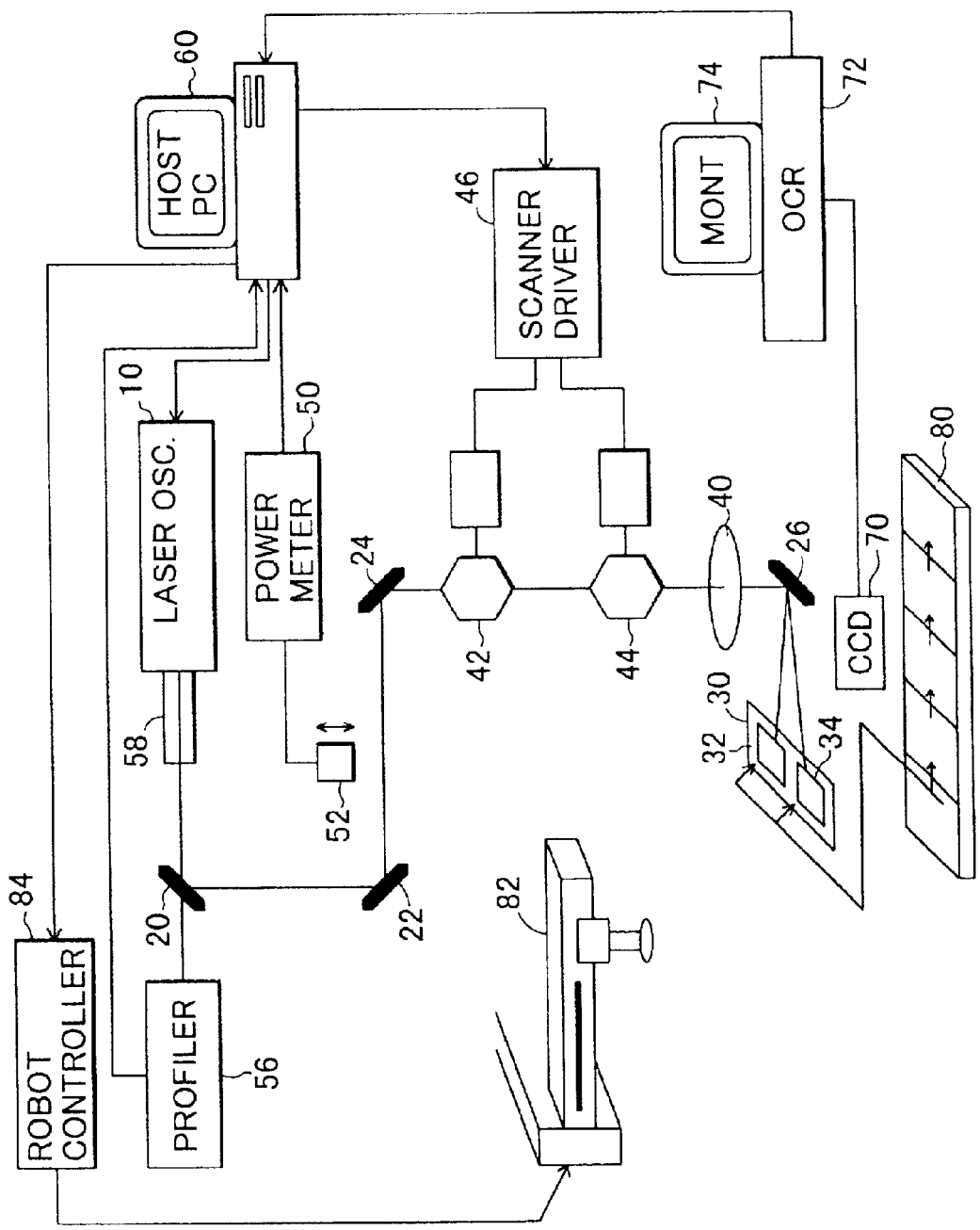
FIG. 1 is a system diagram showing the entire configuration of the laser printing apparatus according to the embodiment of the present invention.

FIG. 1 is a system diagram showing the entire configuration of the laser printing apparatus according to the embodiment of the present invention.

A laser light beam emitted from a laser oscillator 10 is reflected by a half mirror 20 and mirrors 22, 24, 26 and irradiated on either one of MCCs 32, 34 serving as members to be printed which are positioned and fixed on a positioning plate 30. An fθ lens 40 serving as a converging means is disposed on an optical path from the laser oscillator 10 to the MCCs 32, 34 so that light beam emitted from the laser oscillator 10 and collimated is converged and focused at a focusing position. The MCCs 32, 34 are disposed at the focusing position of the fθ lens 40.

Galvano mirrors 42, 44 serving as a scanning means are disposed on the way of the optical path between the mirror 24 and the fθ lens 40. For example, the galvano mirror 42 scans the optical path to the X-axis direction, while the galvano mirror 44 scans the optical path to the Y-axis direction orthogonal to the X-axis direction, whereby the galvano mirrors 42, 44 polarize the positions of the laser beams irradiated on the MCCs 32, 34 to the X- and Y-axis direction. The galvano mirrors 42, 44 are controlled in their scanning direction by a scanner driver 46.

The detector 52 of a power meter 50 can be inserted into and removed from the optical path between the mirror 22 and the mirror 24. When the detector 52 is inserted into the optical path, the power meter 50 can measure the output of the laser light beam emitted from the laser oscillator 10.

The light transmitted through the half mirror 20 is detected by a beam profiler 56. The beam profiler 56 detects the mode of the laser light emitted from the laser oscillator 10. For example, when the laser oscillator 10 is able to operate in a single mode and a multi mode, the beam profiler detects which mode of the laser light is emitted from the laser oscillator.

A beam expander 58 is provided at the light emitting portion of the laser oscillator 10. The beam expander 58 can vary the diameter of the laser light beam irradiated on the MCCs 32, 34.

A host computer (host PC) 60 outputs a control signal to the scanner driver 46 to control the scanning operation of the galvano mirrors 42, 44 to the X- and Y-axis direction to control the irradiated positions of the laser light beam on the MCCs 32, 34 thereby to print characters on the MCCs 32, 34. The host computer 60 controls the output of the laser oscillator 10 so that the output of the laser light detected by the power meter 50 becomes a predetermined value. Further, the host computer 60 controls the laser oscillator 10 so that the mode of the laser light detected by the beam profiler 56 becomes a predetermined mode.

Characters printed on the MCCs 32, 34 are photographed by a charge-coupled device (CCD) 70 and read by a character reader (OCR) 72. The characters thus read are fed back to the host computer 60. The character reader 72 has a monitor 74, whereby the characters photographed by the CCD 70 are displayed on the monitor 74 so that an operator is able to look the printed characters. The kinds of the characters printed on the MCCs 32, 34 include figures, marks etc. in addition to numerals, alphabets etc.

A plurality of trays are mounted on a work tray mount table 80. The MCCs as the members to be printed are placed on the trays. A transfer robot 82 attracts the MCCs placed on the trays mounted on the work tray mount table 80 and transfers the MCCs thus attracted on the positioning plate 30. The MCCs which have been subjected to the laser printing and the character reading are returned on the trays mounted on the work tray mount table 80 by the transfer robot 82. The transfer robot 82 is controlled by a robot controller 84 and the robot controller 84 is controlled by the host computer 60. In this respect, since two MCCs 32, 34 can be placed on the positioning plate 30, when the laser printing and character reading operations have been completed as to one of the two MCCs, the one MCC is transferred to the work tray mount table 80 by the transfer robot 82. During such a transferring operation, the other of the two MMCs can be subjected to the laser printing. Thus, the throughput of the laser printing operation can be improved.

The embodiment is characterized in that an YLF laser is employed as the laser oscillator 10 and the third harmonics of the YLF laser light is employed as the laser light to be outputted therefrom. The laser light of the third harmonics of the YLF laser has the wavelength of 351 nm which is in the ultraviolet range.

The conventional laser printing apparatus has employed laser light in a visible range of the second harmonics (wavelength of 532 nm) outputted from an YAG laser serving as the laser oscillator. When fine characters are printed on a glass type board of glass/Cu by using the second harmonics from the YAG laser, the lines of each character are widened and so the each character is deformed, so that it becomes impossible to discriminate the each character.

In the present embodiment, since the YLF laser emitting the third harmonics of the laser light in the ultraviolet range is employed as a laser oscillator, even if fine characters are printed on a glass type board of glass/Cu, it is possible to discriminate the characters. Thus, the printing quality can be improved as compared with the conventional apparatus.

Explanation will be made as to the printing quality in the present embodiment with reference to FIGS. 2A and 2B.

Figure 2A:
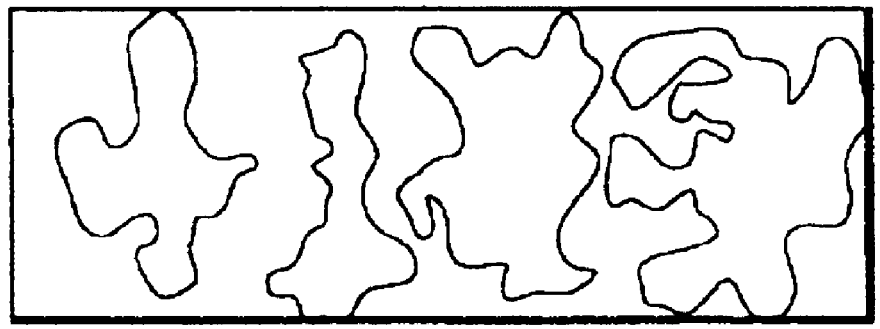
FIGS. 2A and 2B are diagrams for explaining the printing quality of characters printed by using the laser printing apparatus according to the embodiment of the present invention.
Figure 2B:
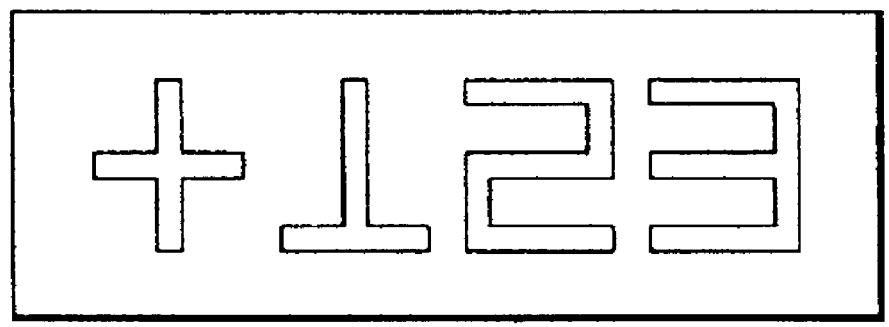

FIG. 2A represents a conventional example where characters are printed on the glass/Cu board by using the laser light in the visible range of the second harmonics (wavelength of 532 nm) outputted from the YAG laser, while FIG. 2B represents an example of the present embodiment where characters are printed on the glass/Cu board by using the laser light in the ultraviolet range of the third harmonics (wavelength of 351 mm) outputted from the YLF laser. In each of these examples, the characters to be printed are "+123". In the conventional method, each character is deformed, so that it is impossible to discriminate each character. In contrast, in the present embodiment, it is possible to discriminate each character, and the printing quality is improved as compared with the conventional method.

When the YLF laser emitting the third harmonics is employed as a laser oscillator emitting the laser light in the ultraviolet range, the stability of the output of the laser oscillator is high and the laser oscillator can be configured at a low cost.

As the laser oscillator emitting the laser light in the ultraviolet range, for example, the YAG laser emitting the third harmonics (wavelength of 355 nm) may be employed other than the YLF laser emitting the third harmonics. In this case, it is confirmed that the quality of the laser printing on the glass type board of glass/Cu is improved. The YAG laser is slightly unstable in the third harmonics outputted therefrom as compared with the third harmonics of the YLF laser but there is no problem practically, and the YAG laser can be configured at a low cost.

The quality of the laser printing was investigated as to the case where the YLF laser emitting the third harmonics is employed as the laser oscillator emitting the laser light in the ultraviolet range and the pulse width of the pulse-shaped laser light is changed. Then, it was proved that the quality of the laser printing can be further improved in a short pulse-width range that the pulse width is 90 nsec or less. When the laser light having the pulse width larger than the aforesaid range is used, since the printing operation using the laser light is performed on the MCC board by a largely thermal-influenced processing, the printing quality is degraded as compared with the case using the laser light having the pulse width of 90 nsec or less. Since the laser printing using the laser light having the pulse width of 90 nsec or less is performed by a less thermal-influenced processing, the printing quality can be improved. The energy density per one pulse necessary in this case is 10 $J/cm^2$ or more.

The quality of the laser printing was investigated as to the case where the YLF laser emitting the third harmonics is employed as the laser oscillator emitting the laser light in the ultraviolet range and the output of the pulse-shaped laser light is changed. Then, it was proved that the quality of the laser printing can be further improved in a low output range that the output of the laser light is 1 mJ/pulse or less. When the laser light having the output larger than the aforesaid range is used, since the printing operation using the laser light is performed on the MCC board by a thermal processing, the printing quality is degraded as compared with the case using the laser light having the output of 1 mJ/pulse or less. Since the laser printing using the laser light having the output of 1 mJ/pulse or less is performed by a less thermal-influenced processing, the printing quality can be improved. The energy density per one pulse necessary in this case is 10 $J/cm^2$ or more.

Further, the quality of the laser printing was investigated as to the case where the YLF laser emitting the third harmonics is employed as the laser oscillator emitting the laser light in the ultraviolet range and the number of shots of the laser pulses repeatedly irradiated on the same area in a superimposed manner (that is, superimposed irradiation number) is changed. Then, it was proved that the quality of the laser printing can be further improved in a range that the superimposed irradiation number is 16 to 32 shots. When the superimposed irradiation number is less than the aforesaid range, since the depth of each groove of the printed characters becomes shallow, the quality of the printed characters is degraded. When the superimposed irradiation number is larger than the aforesaid range, the printing quality is degraded.

In this respect, the superimposed irradiation number (shot number) can be obtained by the following expression.

$$shot = (f \cdot D)/v$$

where f depicts the oscillation frequency of the laser oscillator, D depicts the diameter of a spot of the laser light and v depicts a scanning speed.

Although the aforesaid explanation is made as to the case where the laser printing is performed on the glass type board of glass/Cu by using the YLF laser emitting the third harmonics of the laser light in the ultraviolet range, the printing quality can be improved also in the case where the laser printing is performed on the mullite/W board by using the YLF laser emitting the third harmonics of the laser light in the ultraviolet range. As the condition for further improving the printing quality, it is preferable to set the laser light to have the short-pulse width in the range of 90 nsec or less, to set the laser output in the low output range of 1 mJ/pulse or less, and to set the superimposed irradiation number in a range of 8 to 16 shots Further, although the aforesaid explanation is made as to the case where the laser printing is performed on the ceramic board such as glass/Cu, mullite/W or the like by using the YLF laser emitting the third harmonics of the laser light in the ultraviolet range, the printing quality can be improved also in the case where the laser printing is performed on the silicon board by using the YLF laser emitting the third harmonics of the laser light in the ultraviolet range. As the condition for further improving the printing quality, it is preferable to set the laser light to have the short-pulse width in the range of 90 nsec or less, to set the laser output in the low output range of 1 mJ/pulse or less, and to set the superimposed irradiation number in a range of 3 to 10 shots. In this case, the energy density of one pulse irradiated on the member to be printed is 10 J/cm$^2$ or more.

As described above, according to the present invention, the printing quality of the laser printing can be improved.

What is claimed is:

1. A laser printing method for printing on a member to be printed by using laser light emitted from a laser oscillator, said laser printing method comprising a step of printing on said member using pulse-shaped laser light emitted from an YLF laser oscillator serving as said laser oscillator which emits laser light of third harmonics in an ultraviolet range, and a step of controlling a number of shots of said pulse-shaped laser light irradiated on said member in a superimposed manner to print characters thereon.

2. A laser printing method according to claim 1,
wherein said pulse-shaped laser light emitted from said YLF laser oscillator has a pulse width of 90 nsec or less, and
energy of the pulse-shaped laser light is 1 mJ/pulse or less.

3. A laser printing method according to claim 1,
wherein the printing operation using said YLF laser oscillator is performed in a condition that an energy of the laser pulse irradiated on a surface of said member to be printed is at least 10 J/cm$^2$,
and a pulse width of the pulse-shaped laser light emitted from said YLF laser oscillator is 90 nsec or less.

4. A laser printing method according to claim 1,
wherein the printing operation using said YLF laser oscillator is performed in a condition that an energy of the laser pulse irradiated on a surface of said member to be printed is at least 10 J/cm$^2$,
and energy of the pulse-shaped laser light emitted from said YLF laser oscillator is 1 mJ/pulse or less.

5. A laser printing method according to claim 1,
further comprising the steps of reading characters printed on said member by said printing step and displaying said characters on a monitor.

6. A laser printing method according to claim 1,
wherein said member to be printed is a glass/Cu.

7. A laser printing method according to claim 6,
wherein said pulse-shaped laser light has a pulse width of 90 nsec or less.

8. A laser printing method according to claim 6,
wherein said pulse-shaped laser light has an energy of 1 mJ/pulse or less.

9. A laser printing method according to claim 6,
wherein said pulse-shaped laser light is irradiated on a surface of said member to be printed with an energy of at least 10 J/cm$^2$.

10. A laser printing method according to claim 1,
wherein said pulse-shaped laser light emitted from said YLF laser has a pulse width of 90 nsec or less.

11. A laser printing method according to claim 1,
wherein said pulse-shaped laser light has an energy of 1 mJ/pulse or less.

12. A laser printing method for printing characters on a member to be printed by using laser light emitted from a laser oscillator, said laser printing method comprising the steps of:
emitting a pulse-shaped laser light from a YLF laser oscillator which emits laser light of third harmonics in an ultraviolet range;
controlling an output of said YLF laser oscillator;
scanning said pulse-shaped laser light in X and Y directions, while focusing said pulse-shaped laser light on said member; and
controlling a number of shots of said pulse-shaped laser light irradiated on said member in a superimposed manner to print characters thereon.

13. A laser printing method according to claim 12,
wherein said controlling step controls an energy of the laser pulse irradiated on a surface of said member to be printed to be at least 10 J/cm$^2$ or more.

14. A laser printing method according to claim 13,
wherein said controlling step further controls a pulse width of said pulse-shaped laser light emitted from said YLF laser oscillator to be 90 nsec or less.

15. A laser printing method according to claim 13,
wherein said controlling step further controls the energy of the pulse-shaped laser light emitted from said YLF laser oscillator to be 1 mJ/pulse or less.

16. A laser printing method according to claim 12,
wherein said controlling step further controls the number of shots of laser light emitted repeatedly in a superimposed manner on said member to be printed by the pulse-shaped laser light emitted from said YLF laser oscillator in a range of 16 to 32, and
said member to be printed is a glass/Cu.

17. A laser printing method according to claim 16,
wherein said controlling step controls an energy of the laser pulse irradiated on a surface of said member to be printed to be at least 10 J/cm$^2$.

18. A laser printing method according to claim 17,
wherein said controlling step further controls the pulse width of the pulse-shaped laser light emitted from said YLF laser oscillator to be 90 nsec or less.

19. A laser printing method according to claim 16,
wherein said controlling step further controls the energy of the pulse-shaped laser light emitted from said YLF laser oscillator to be 1 mJ/pulse or less.

20. A laser printing method according to claim 19,
wherein said controlling step further controls the pulse width of the pulse-shaped laser light emitted from said YLF laser oscillator to be 90 nsec or less.

21. A laser printing method according to claim 12, further comprising the steps of reading said characters printed on said member and displaying said characters on a monitor.

22. A laser printing apparatus comprising:

YLF a laser oscillator;

scanning means for scanning laser light emitted from said laser oscillator;

converging means for converging the laser light emitted from said laser oscillator on a member to be printed, so as to print on said member to be printed by using the laser light emitted from said laser oscillator, wherein said laser oscillator is a solid-state laser oscillator which emits laser light of third harmonics in an ultraviolet range; and controlling means for controlling said oscillator, said scanning means and said converging means, thereby controlling a number of shots of said laser light irradiated on said member to print characters thereon by said pulse-shaped laser light emitted from said YLF laser oscillator in a superimposed manner.

23. A laser printing apparatus according to claim 22, wherein said laser oscillator emits pulse-shaped laser light having a pulse width of 90 nsec or less.

24. A laser printing apparatus according to claim 23, wherein said laser oscillator emits pulse-shaped laser light having an energy of 1 mJ/pulse or less.

25. A laser printing apparatus according to claim 22, wherein said laser oscillator emits pulse-shaped laser light having an energy of 1 mJ/pulse or less.

26. A laser printing apparatus according to claim 22, wherein said converging means is an fθ lens.

27. A laser printing apparatus according to claim 22, further comprising means for reading characters printed on said member using said laser light and displaying said characters on a monitor.

28. A laser printing apparatus comprising:

a table arranged to support plural members on which to print characters;

a positioning plate;

a robot for carrying one of said members from said table to said positioning plate;

a YLF laser oscillator for emitting pulse-shaped laser light of third harmonics in an ultraviolet range;

a scanner for scanning said pulse-shaped laser light emitted from said YLF laser oscillator in X and Y directions;

focusing means for focusing said pulse-shaped laser light emitted from said YLF laser oscillator on said member on said positioning plate to be printed by using said pulse-shaped laser light emitted from said YLF laser oscillator; and a computer for controlling said robot carrying said member, controlling said YLF laser oscillator and said scanner, and controlling a number of shots of said laser light irradiated on said member.

* * * * *